(12) United States Patent
Guo et al.

(10) Patent No.: US 12,525,984 B2
(45) Date of Patent: Jan. 13, 2026

(54) NOISE-SHAPING ADC WITH OVERLOAD RECOVERY

(71) Applicant: QUALCOMM Incorporated, San Diego, CA (US)

(72) Inventors: Yuhua Guo, San Diego, CA (US); Yiqiao Zhang, San Diego, CA (US); Yan Wang, San Diego, CA (US); Xiaopeng Zhong, Seattle, WA (US); Elias Dagher, Laguna Niguel, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 112 days.

(21) Appl. No.: 18/442,006

(22) Filed: Feb. 14, 2024

(65) Prior Publication Data

US 2025/0260412 A1 Aug. 14, 2025

(51) Int. Cl.
*H03M 1/08* (2006.01)
*H03M 1/46* (2006.01)

(52) U.S. Cl.
CPC ......... *H03M 1/0854* (2013.01); *H03M 1/462* (2013.01); *H03M 1/466* (2013.01)

(58) Field of Classification Search
CPC ..... H03M 1/0854; H03M 1/462; H03M 1/466
See application file for complete search history.

(56) References Cited

U.S. PATENT DOCUMENTS

| | | | | |
|---|---|---|---|---|
| 5,742,246 A * | 4/1998 | Kuo | ...................... | H03M 3/362 |
| | | | | 341/172 |
| 6,064,326 A * | 5/2000 | Krone | ................... | H03M 3/362 |
| | | | | 341/118 |
| 6,157,331 A * | 12/2000 | Liu | ........................ | H03M 3/364 |
| | | | | 341/120 |
| 8,144,042 B2 * | 3/2012 | Mathe | ..................... | G06F 30/23 |
| | | | | 326/46 |
| 8,344,921 B2 * | 1/2013 | Lin | ........................ | H03M 3/412 |
| | | | | 375/296 |
| 9,455,737 B1 * | 9/2016 | Rajaee | ................... | H03M 3/464 |
| 9,859,916 B1 * | 1/2018 | Verdant | ................... | H03M 3/50 |
| 10,084,474 B1 * | 9/2018 | Wang | ....................... | H03M 3/50 |
| 11,522,556 B1 * | 12/2022 | Sheikholeslami | .... | H03M 3/426 |
| 2016/0065232 A1 * | 3/2016 | Dagher | ................. | H03M 3/458 |
| | | | | 341/158 |
| 2016/0072275 A1 * | 3/2016 | Caldwell | ............... | H03M 3/484 |
| | | | | 361/91.1 |
| 2016/0380646 A1 * | 12/2016 | Kauffman | ........... | H03M 1/0607 |
| | | | | 341/118 |
| 2020/0083900 A1 * | 3/2020 | Shabra | .................. | H03M 3/418 |

* cited by examiner

*Primary Examiner* — Thomas D Alunkal
(74) *Attorney, Agent, or Firm* — Loza & Loza, LLP (57) ABSTRACT

A sigma-delta analog-to-digital converter includes a noise-shaping quantizer that performs noise shaping in the absence of an overload condition. An overload detector monitors for the presence of the overload condition and disables the noise shaping for an overload recovery period in response to a detection of the overload condition.

17 Claims, 5 Drawing Sheets

NOISE-SHAPING ADC WITH OVERLOAD RECOVERY

TECHNICAL FIELD

The present application relates generally to analog-to-digital converters, and more specifically to a noise-shaping analog-to-digital converter (ADC) with overload recovery.

BACKGROUND

Noise-shaping successive-approximation-register (SAR) analog-to-digital converters offer high resolution yet have relatively low power consumption. An important application of a noise-shaping SAR ADC is to function as the quantizer in a sigma-delta ADC. The sigma-delta ADC includes a high-order loop filter with at least two stages of integration. This integration in combination with the noise-shaping SAR quantizer suffers from overload instability such that a digital output of the sigma-delta ADC either stays saturated or oscillates without recovery.

SUMMARY

In accordance with an aspect of the disclosure, a sigma-delta analog-to-digital converter is provided that includes: a high-order loop filter; a noise-shaping quantizer configured to quantize an analog signal processed by the high-order loop filter; and an overload detector configured to disable noise shaping in the noise-shaping quantizer in response to a detection of an overload condition.

In accordance with another aspect of the disclosure, a method of overload recovery is provided that includes: monitoring whether a noise-shaping quantizer is in an overload condition while the noise-shaping quantizer performs noise shaping during normal operation of the noise-shaping quantizer; and disabling the noise shaping in the noise-shaping quantizer for an overload recovery period in response to a detection of the overload condition.

Finally, in accordance with yet another aspect of the disclosure, a sigma-delta analog-to-digital converter is provided that includes: a noise-shaping successive-approximation-register quantizer including a passive integrator configured to form an integration signal while the noise-shaping successive-approximation-register quantizer does not have an overload condition; and an overload detector configured to disable the passive integrator for an overload recovery period in response to a detection of the overload condition.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

The overload instability of a high order sigma-delta ADC (having at least two stages of integration in the loop filter) may be addressed by resetting either the entire loop filter or part of the loop filter to zero states. But note that a sigma-delta ADC requires past information for the integration in the loop filter to work properly. The resetting of one or more integration stages thus results in an erroneous digital output signal from the sigma-delta ADC until the memory in the integration stages may be recovered. In another approach to address overload, a saturating clipper may be embedded in a positive feedback loop within the loop filter. But the saturating clipper then tends to compromise normal (non-saturated) operation of the sigma-delta ADC and may also result in audible clicks or other types of distortion should the sigma-delta ADC be used to digitize an audio signal.

To avoid the problems of these overload solutions, a noise-shaping ADC is disclosed in which the noise-shaping is selectively disabled in response to the digital output signal from the noise-shaping ADC exceeding a saturation threshold. The noise-shaping ADC is also denoted herein as a noise-shaping quantizer. After an overload recovery period following the disablement of the noise shaping, the noise shaping is again enabled. In this fashion, the loop filter integration stages are not reset nor does any clipping occur in the loop filter yet the noise-shaping ADC recovers from the output saturation without any overload instability.

Figure 1:
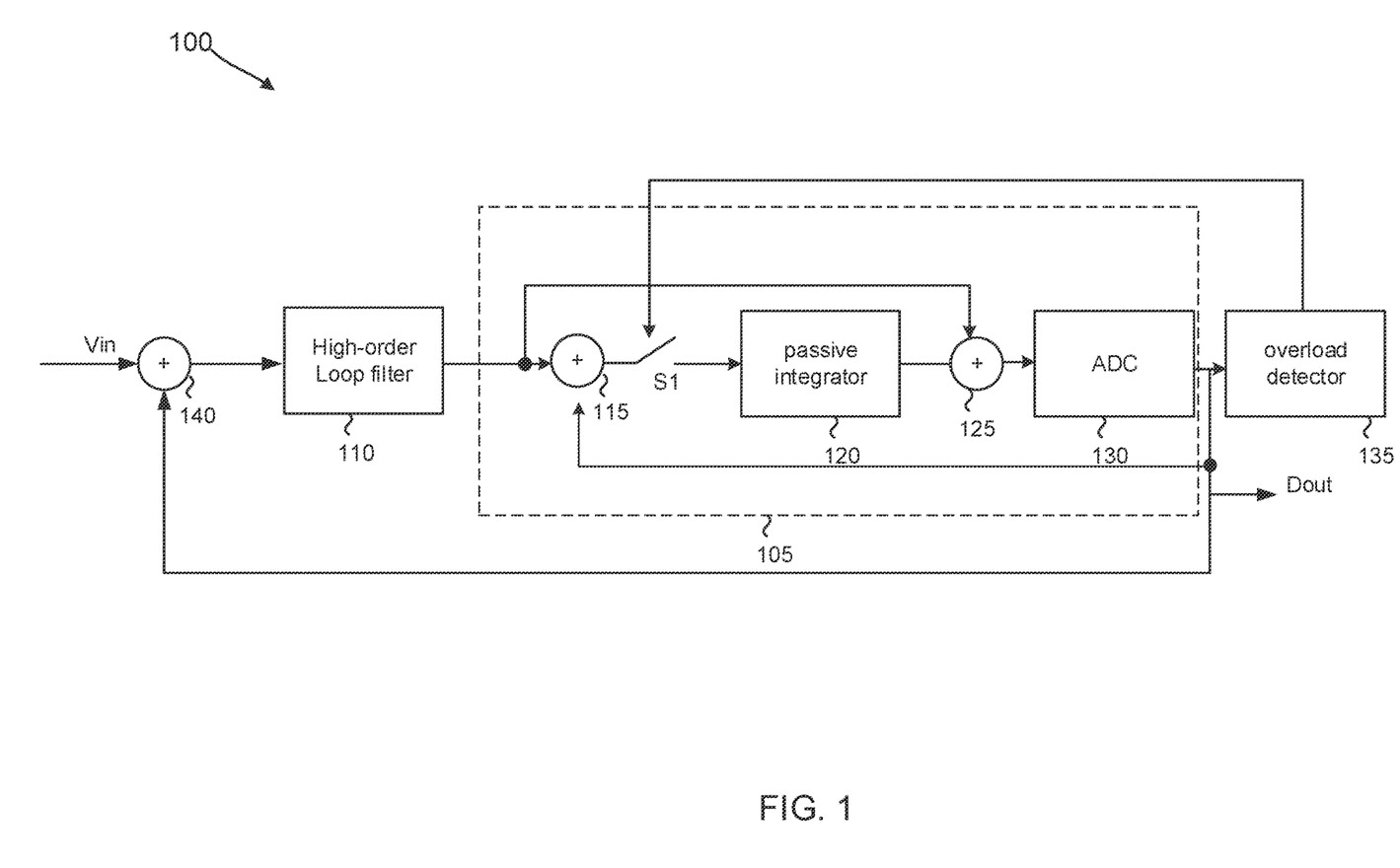
FIG. 1 is a high-level diagram of a sigma-delta ADC including a noise-shaping SAR ADC with overload recovery through a deactivation of the noise shaping in accordance with an aspect of the disclosure.

The following discussion will focus on a sigma-delta ADC in which the noise-shaping quantizer is a noise-shaping successive-approximation-register (SAR) quantizer. However, the selective disablement of the noise shaping in response to an overload detection is applicable to any suitable noise-shaping quantizer such as a noise-shaping time-to-digital converter (TDC). An example sigma-delta ADC 100 that includes a noise-shaping SAR quantizer 105 in which the noise shaping is selectively disabled in response to an overload detection is shown in FIG. 1. The "sigma" (integration) of the sigma-delta ADC 100 occurs in a high-order loop filter 110. As used herein, a "high-order" loop filter such as loop filter 110 will be understood to include at least two integration stages. An integrated output signal from the loop filter 110 is processed by the noise-shaping SAR quantizer 105, which includes an ADC 130 that produces a digital output signal (Dout). A capacitive digital-to-analog converter (CDAC) (not shown in FIG. 1) functions to convert the digital output signal back into analog form to be subtracted from the integrated output signal at an adder 115 to form a residue that is integrated in a passive integrator 120 to form a noise-shaped integration signal. The noise-shaped integration signal is summed with an input voltage sample (Vin) at an adder 125 to form an initial summed signal. The ADC 130 applies an active gain to the noise-shaped integration signal portion of the initial summed signal as discussed further herein to form a final summed signal that equals a sum of the input voltage sample and the amplified noise-shaped integration signal. The summed signal is quantized in the ADC 130 to form the digital output signal Dout.

During the formation of the noise-shaped integration signal, a plurality of integration switches (represented by a single switch S1 for illustration clarity) close to couple the CDAC to integration capacitors (not shown in FIG. 1) in the passive integrator 120. To address an overload condition, an overload detector 135 may open the integration switches to disable the noise shaping for an overload recovery period. The overload detector 135 may detect for a saturation or overload condition in the digital output signal. Should an overload be detected, the overload detector 135 opens the integration switches as represented by switch S1 to disable the noise shaping. The integration output signal from the high-order loop filter 110 thus bypasses the passive integrator 120 to be summed at adder 125 with the input voltage sample.

The integration switches as represented by switch S1 are kept open for the overload recovery period that may be static or dynamic depending upon the implementation. At an expiration of the overload recovery period, the integration switches function normally again during a subsequent integration phase for the sigma-delta ADC 100. The digital output signal is also converted by a CDAC (not illustrated) to be subtracted from the input voltage sample at an adder 140 to form the "delta" of the sigma-delta operation for the sigma-delta ADC 100.

In contrast to an overload recovery through a resetting of the loop filter 110, the functionality of the sigma-delta ADC 100 is not disturbed by the action of the overload detector 135. In this fashion, downstream usage of the digital output signal is not affected by interruptions in the sigma-delta ADC functionality. The advantageous result of the overload recovery through selective disablement of the noise shaping is that the dynamic range of the sigma-delta ADC 100 is effectively extended. In addition, note that the overload recovery disclosed herein is robust not only to overload caused by an input signal having too high of a magnitude but also from coefficient non-ideality within the sigma-delta ADC 100 (e.g., coefficient non-ideality in a continuous-time integration stage within the high-order loop filter 110)

Before the overload recovery from selective disablement of the noise shaping is discussed in more detail, some noise-shaping SAR ADC concepts during normal (non-overloaded) operation will first be reviewed. The summation of the integrated residue with the current input sample in a noise-shaping SAR ADC is quite advantageous because the quantization noise may then be frequency shifted out of the bandwidth of interest for the signal being quantized. The integrated residue for a current ADC calculation cycle is based upon a function of the integrated residue for a preceding ADC calculation cycle and the residue for the preceding cycle as given by the following Equation (1):

$$Vint(n)=\alpha*Vint(n-1)+(1-\alpha)*Vres(n-1) \qquad \text{Eq. (1)}$$

where Vint(n) is the integrated residue for the current cycle, a is a proportionality constant that is less than one, Vint(n−1) is the integrated residue from the preceding cycle, and Vres(n−1) is the residue from the preceding cycle. As the proportionality constant α is increased towards unity, the sharper is the cutoff for the noise-shaping frequency shifting of the quantization noise. However, power consumption may increase as the proportionality constant α approaches unity too closely. Thus, the following discussion will assume that the proportionality constant α equals 0.8 but it will be appreciated that the proportionality constant α may be greater than or less than 0.8 in alternative implementations. With the proportionality constant α equaling 0.8, the current differential integration voltage Vin(n) becomes equal to 0.8*Vint(n−1)+0.2*Vres(n−1).

Prior to the summation with the current input sample, the integrated residue is amplified according to a gain. Based upon this gain, it can be shown that a noise-shaping SAR ADC has a noise transfer function (NTF) in the Z domain as given by the following Equation (2):

$$NTF=(1-\alpha*Z-1)/(1+g*(1-\alpha)-\alpha)Z^{-1} \qquad \text{Eq. (2)}$$

where g is the gain applied to the integrated residue. If the gain is four, the NTF simplifies to $1-0.8Z^{-1}$ so that the zero of the noise transfer function is close to the unit circle, which provides the desired sharp cutoff for the frequency shifting of the quantization noise. It will thus be assumed in the following discussion that the gain applied to the integrated residue is four, but it will be appreciated that a gain higher or lower than four may be used in alternative implementations.

A loop filter that provides the desired proportionality a and gain g is a critical component of a noise-shaping SAR ADC. Note that this loop filter is internal to the noise-shaping SAR quantizer 105 and is thus distinct from the high-order loop filter 110 discussed earlier for the sigma-delta ADC 100. During an integration stage, the loop filter forms the current integration voltage sample as discussed with respect to Eq. (1). The loop filter then amplifies the current integration voltage sample according to the gain g to provide an amplified current integration voltage sample. In a SAR conversion phase, the amplified integration voltage sample is summed with the current input voltage sample from the input signal being digitized to provide a summed signal that will be converted according to a SAR-based search into the digital output signal. It may thus be seen that the loop filter has an inherent analog character and will typically dominate the power consumption of the noise-shaping SAR ADC.

To limit the power consumption of the loop filter, the loop filter passively forms integrated residue of Eq. (1) as represented by the operation of the passive integrator 120. The integration switches as represented by switch S1 are part of the passive integrator 120 but are shown separately in FIG. 1 for illustration clarity. The passive integrator 120 forms the integrated residue through charge sharing between integration capacitors and CDAC capacitors in the CDAC of the noise-shaping SAR quantizer 105. An example of this passive integration is shown in more detail in FIG. 2 for the noise-shaping SAR quantizer 105.

Figure 2:
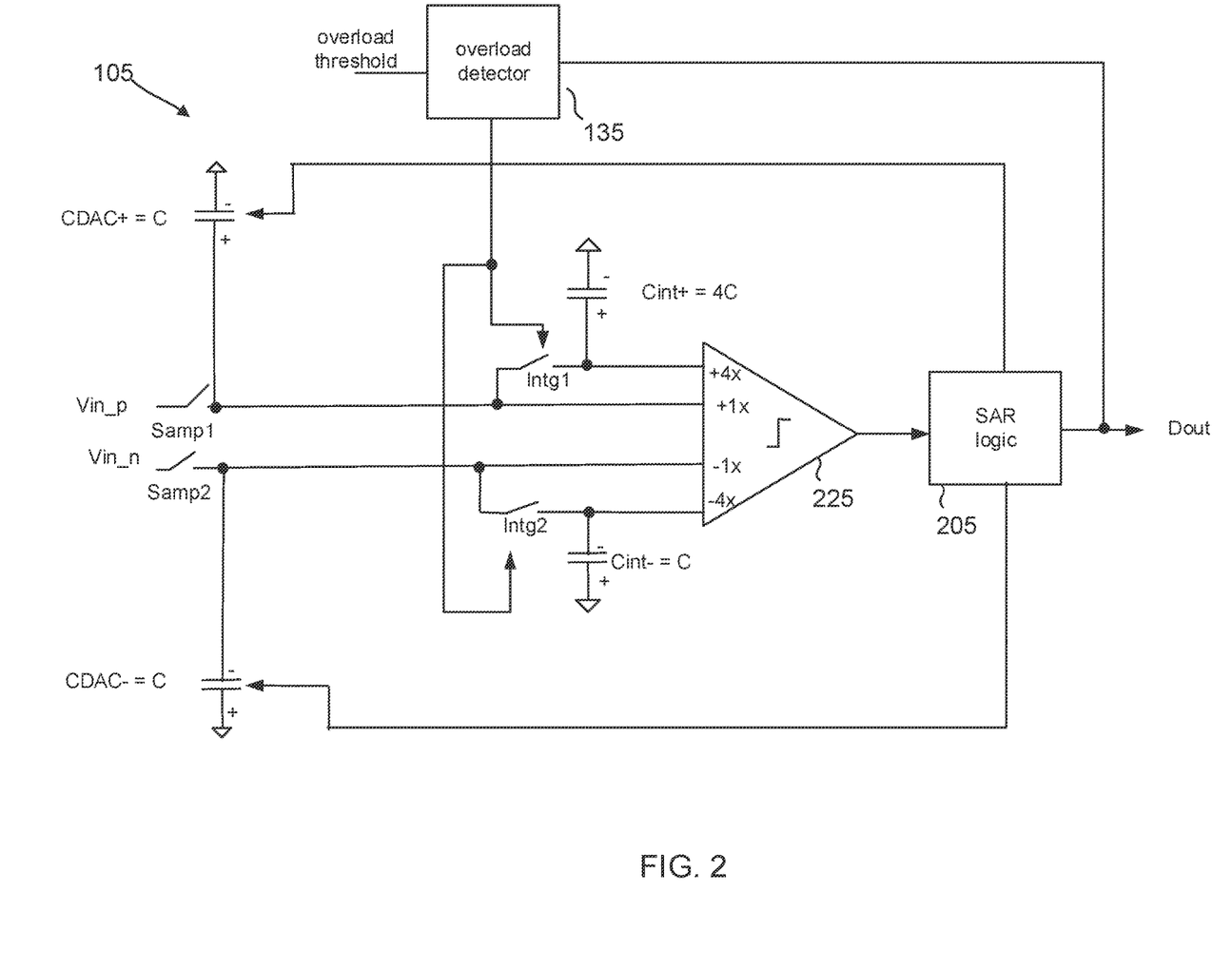
FIG. 2 is a more-detailed illustration of the noise-shaping SAR ADC of FIG. 1 in accordance with an aspect of the disclosure.

A CDAC is represented by a positive CDAC capacitor CDAC+ and a negative CDAC capacitor CDAC−. The positive CDAC capacitor CDAC+ is designated as positive because it stores a positive portion of a differential residue voltage. Conversely, the negative CDAC capacitor CDAC− is designated as negative because it stores a negative portion of the differential residue voltage. The passive integrator 120 is represented by a positive integration capacitor Cint+ and a negative integration capacitor Cint−. Analogously to the positive CDAC capacitor CDAC+, the positive integration capacitor Cint+ is designated as positive because it stores a positive component of a differential integration voltage. Similarly, the negative integration capacitor Cint− stores a negative component of the integration voltage. Prior to a start of a current integration phase, the CDAC capacitors thus store a differential residue voltage from a previous ADC calculation. Similarly, the integration capacitors store a differential integration voltage from the previous ADC calculation.

Before a current integration phase is initiated, a positive terminal of the positive CDAC capacitor CDAC+ is isolated from a positive terminal of the positive integration capacitor Cint+ through an opened first integration switch (Intg1). The positive terminal of the positive CDAC capacitor CDAC+ is also denoted herein as a positive output terminal of the CDAC. The negative terminals for the positive capacitors CDAC+ and Cint+ are coupled to ground. Similarly, a negative terminal of the negative CDAC capacitor CDAC− is isolated from a negative terminal of the negative integration capacitor Cint− through an opened second integration switch (Intg2). The negative terminal of the negative CDAC capacitor CDAC− is also denoted herein as a negative output terminal of the CDAC. The positive terminals of the negative capacitors CDAC− and Cint− are coupled to ground. As defined herein, a positive terminal of a capacitor is defined as the capacitor terminal being charged to a higher voltage as compared to the capacitor's negative terminal.

During a current integration phase, the integration switches Intg1 and Intg2 close to allow charge sharing between the CDAC capacitors and the integration capacitors. Each of the CDAC capacitors has a capacitance represented by a letter C. A capacitance of each of the integration capacitors equals 4*C. A current differential integration voltage (Vint(n)) that is imposed between the positive terminal of the positive integration capacitor Cint+ and the negative terminal of the negative integration capacitor thus satisfies Eq. (1) and is advantageously produced in a passive fashion through mere charge sharing. In alternative implementations, the current integration voltage may also be produced not only through charge sharing with the CDAC but also through capacitor stacking.

As noted with regard to Eq. (2), it is advantageous to apply a gain of four to the current integration voltage to produce a current amplified integration voltage of 4*Vint(n). This gain may be applied during a subsequent SAR conversion phase in a subsequent ADC calculation cycle because in each ADC calculation cycle, the SAR conversion phase precedes the integration phase. During the SAR conversion phase, the integration switches are open. A first sampling switch (Samp1) closes to couple a positive component Vin_p of the current differential input voltage sample to the positive terminal of the positive CDAC capacitor CDAC+. Similarly, a second sampling switch (Samp2) closes to couple a negative component Vin_n of the current differential input voltage sample to the negative terminal of the negative CDAC capacitor CDAC−.

To apply the active gain to the current integration voltage Vint(n), the ADC 130 (FIG. 1) may include a multi-input comparator 225 that applies the gain of four through a corresponding differential pair of transistors (not illustrated) that couple to a pair of input terminals +4× and −4×. In particular, the positive terminal of the positive integration capacitor Cint+ couples to the +4× input terminal. Similarly, the negative terminal of the negative integration capacitor Cint− couples to the −4× input terminal. In addition, the positive terminal of the positive CDAC capacitor CDAC+ couples to a +1× input terminal of the multi-input comparator 225. Similarly, the negative terminal of the negative CDAC capacitor CDAC−couples to a −1× input terminal of the multi-input comparator 225. As implied by the "1×" designation of the +1× and −1× input terminals, the multi-input comparator 225 applies a unit gain through a corresponding differential pair of transistors (not illustrated) that couple to the pair of input terminals +1× and −1×. The multi-input comparator 225 may thus form a summed signal that equals Vin plus 4*Vint(n). However, it will be appreciated that a gain higher than or less than four may be used in alternative implementations. The multi-input comparator 225 then compares the resulting summed signal to a reference voltage (not illustrated) during the SAR conversion phase. A SAR logic circuit 205 such as a SAR finite-state machine may then adjust a capacitance of the CDAC through a SAR-based search to convert the summed signal into the digital output signal Dout. The multi-input comparator 225 thus not only functions as part of the ADC 130 but also as the active component of the loop filter for the noise-shaping SAR quantizer 100.

Figure 3:
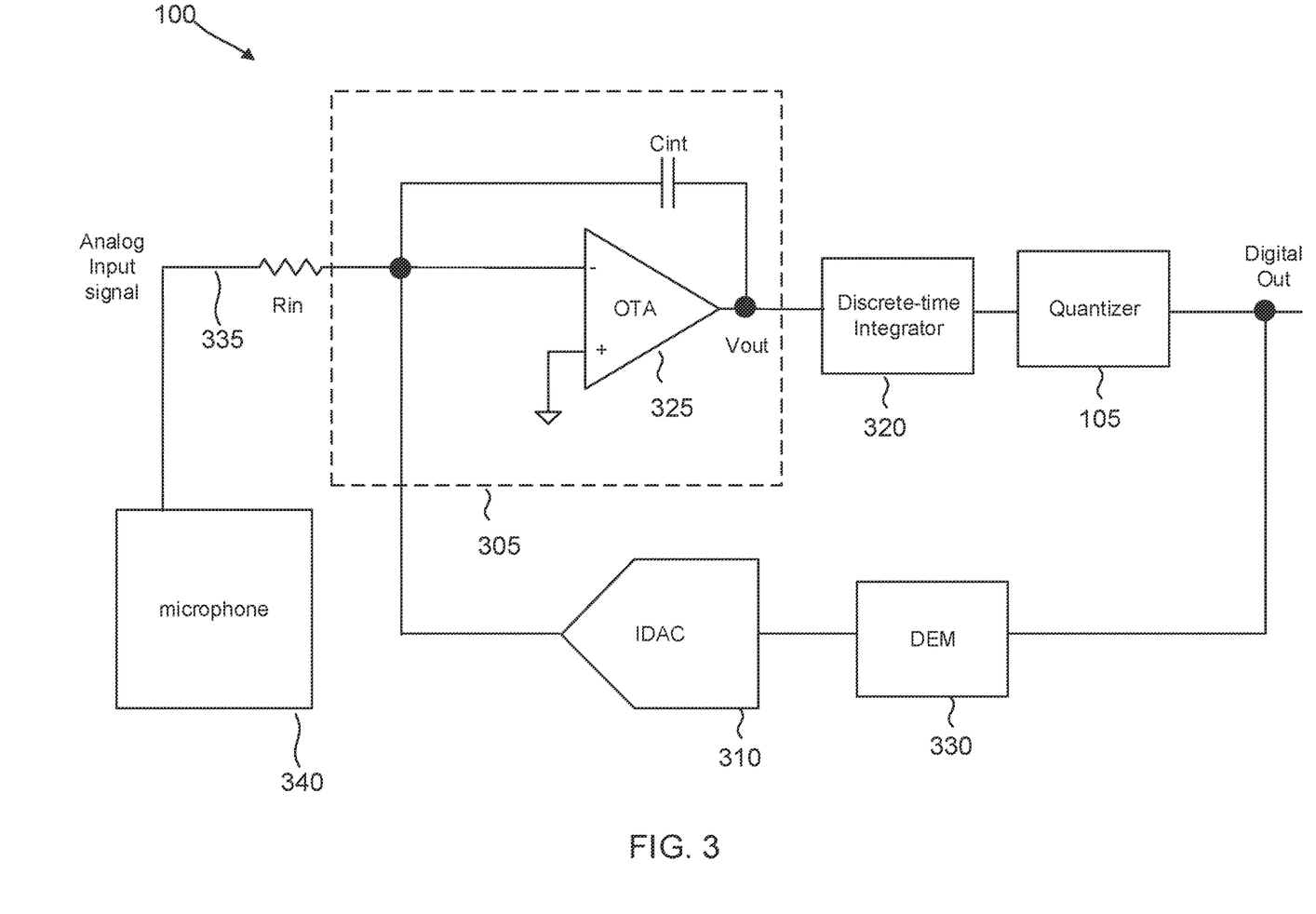
FIG. 3 is a more-detailed illustration of the sigma-delta ADC of FIG. 1 in accordance with an aspect of the disclosure.
Figure 4:
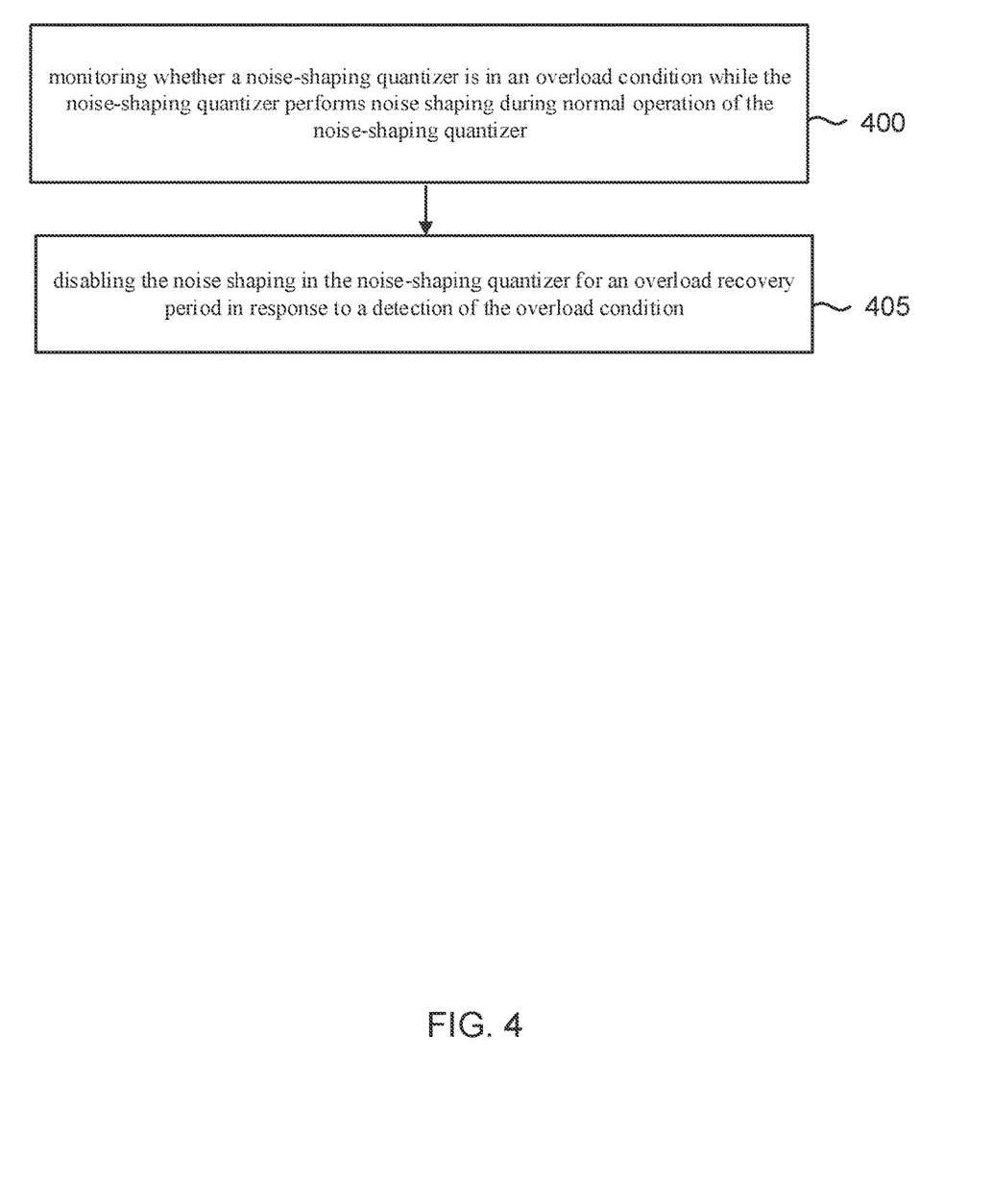
FIG. 4 is a flowchart of an example overload recovery method for a noise-shaping quantizer in accordance with an aspect of the disclosure.

The sigma-delta ADC 100 including the noise-shaping SAR quantizer 105 is shown in more detail in FIG. 3. A first integration stage 305 is a continuous-time integrator that integrates according to a resistor-capacitor (RC) time constant. An input resistor Rin functions as the R in the RC time constant. An input signal being quantized such as an audio signal from a micro-electromechanical system (MEMS) microphone 340 drives an input terminal 335 of the input resistor whereas another terminal of the input resistor couples to an inverting terminal of a differential amplifier such as an operational transconductance amplifier (OTA) 325. An integration capacitor that functions as the C in the RC time constant couples between the inverting terminal and an output terminal of the OTA 325. The time constant thus equals Rin*Cint, where Rin is the resistance of the input resistor and Cint is the capacitance of the integration capacitor. A feedback current digital-to-analog converter (IDAC) 310 as clocked by an IDAC clock (clk) signal also drives the inverting terminal.

A discrete-time integrator 320 integrates an output voltage signal Vout from the first integration stage 305 to provide an integrated signal that is quantized by the quantizer 105 to provide the digital output signal (Dout). The combination of the first integration stage 305 and the discrete-time integrator 320 is an example implementation of the high-order loop filter 110 of FIG. 1. After processing by an optional dynamic element matching (DEM) function 330, the digital output signal feeds back through the IDAC 310 to the inverting node of the OTA 325.

The normal operation of the noise-shaping SAR quantizer 105 in the sigma-delta ADC 100 is quite advantageous because it shifts the quantization noise outside of a frequency band of interest for the input signal being quantized as discussed previously. But the combination of the high-order loop filter 110 and the noise-shaping SAR quantizer may result in non-recoverable instability as also discussed previously. Referring again to FIG. 2, the overload detector 135 thus disables (opens) the integration switches such as the integration switches Intg1 and Intg2 to disable noise shaping in response to a detection of an overload or saturation in the digital output signal. For example, the overload detector 135 may compare the digital output signal to a digital overload threshold. If the digital output signal exceeds the digital overload threshold, the overload detector 135 disables the integration switches for an overload recovery period that extends over at least one ADC calculation cycle. In each ADC calculation cycle that occurs during the overload recovery period, no noise shaping occurs because the formation of the current integration voltage Vint(n) as described with respect to Eq. (1) is prevented. It will be appreciated that the detection of the overload condition may be performed in alternative implementations without the comparison of the digital output signal to an overload threshold.

Figure 5:
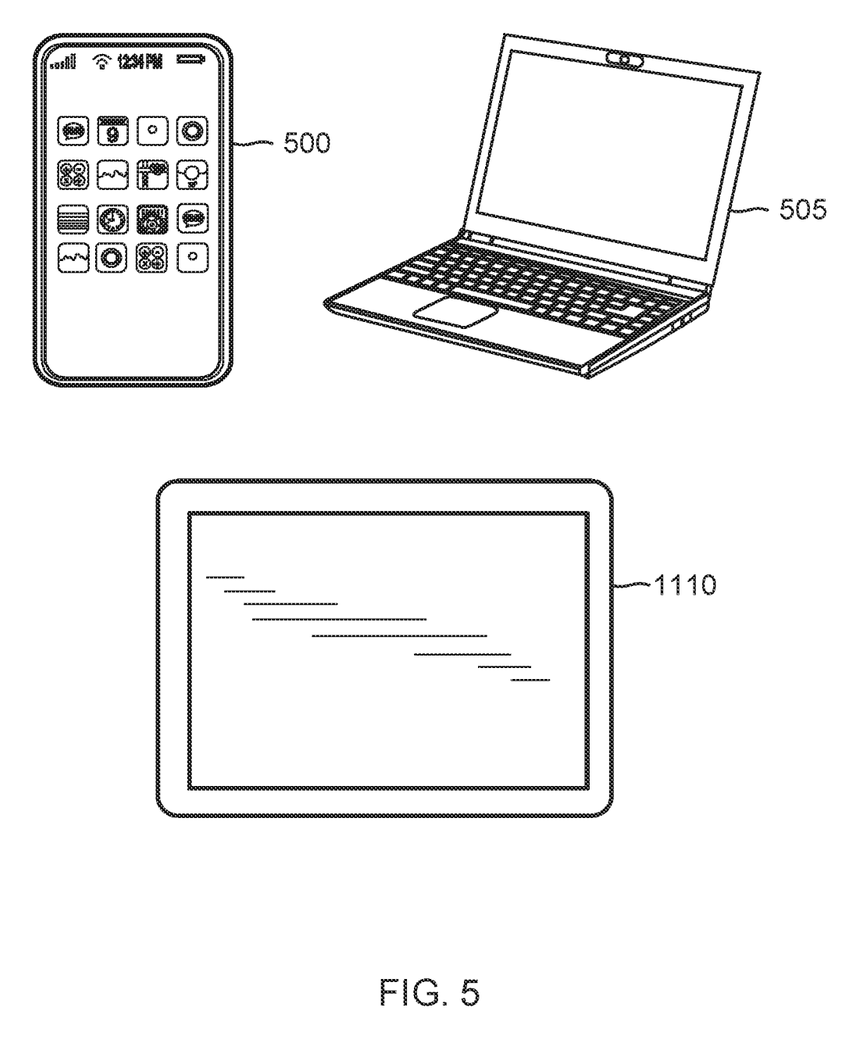
FIG. 5 illustrates some example electronic systems including a microphone generating an audio signal that is converted by a sigma-delta ADC including a noise-shaping SAR quantizer with overload recovery in accordance with an aspect of the disclosure.

A method of overload recovery for a noise-shaping quantizer will now be discussed regarding the flowchart of FIG. 5. The method includes an act 400 of monitoring whether a noise-shaping quantizer is in an overload condition while the noise-shaping quantizer performs noise shaping during normal operation of the noise-shaping quantizer. The monitoring of the noise-shaping SAR quantizer 105 by the overload detector 135 is one example of act 400. The method further includes an act 405 of disabling the noise shaping in the noise-shaping quantizer for an overload recovery period in response to a detection of the overload condition. The disabling of the integration switches in response to an overload detection by the overload detector 135 is one example of act 405.

A sigma-delta ADC including a noise-shaping quantizer with overload recovery as disclosed herein may be incorporated in a wide variety of electronic systems. For example, as shown in FIG. 5, a cellular telephone 500, a laptop computer 505, and a tablet PC 510 may all include an analog-to-digital converter that functions to process an audio signal from a micro-electromechanical system (MEMS) microphone in accordance with the disclosure. Other exemplary electronic systems such as an earbud, a music player, a video player, a communication device, and a personal computer may also be configured with an analog-to-digital converter constructed in accordance with the disclosure.

The disclosure will now be summarized through the following example clauses:

Clause 1. A sigma-delta analog-to-digital converter, comprising:
  a high-order loop filter;
  a noise-shaping quantizer configured to quantize an analog signal processed by the high-order loop filter; and
  an overload detector configured to disable noise shaping in the noise-shaping quantizer in response to a detection of an overload condition.

Clause 2. The sigma-delta analog-to-digital converter of clause 1, wherein the noise-shaping quantizer is a noise-shaping successive-approximation-register quantizer.

Clause 3. The sigma-delta analog-to-digital converter of any of clauses 1-2, wherein the overload detector is further configured to compare a digital output signal from the noise-shaping quantizer to an overload threshold to detect the overload condition.

Clause 4. The sigma-delta analog-to-digital converter of clause 2, wherein the noise-shaping successive-approximation-register quantizer comprises:
  a capacitive digital-to-analog converter;
  a passive integrator; and
  a plurality of integration switches configured to couple the capacitive digital-to-analog converter to the passive integrator during an integration phase, wherein the overload detector is further configured to prevent the plurality of integration switches from closing during an overload recovery period in response to the detection of the overload condition.

Clause 5. The sigma-delta analog-to-digital converter of clause 4, wherein the capacitive digital-to-analog converter includes a positive output terminal and a negative output terminal, and wherein passive integrator includes a positive integration capacitor and a negative integration capacitor, and wherein the plurality of integration switches includes a first integration switch coupled between the positive output terminal and the positive integration capacitor and includes a second integration switch coupled between the negative output terminal and the negative integration capacitor.

Clause 6. The sigma-delta analog-to-digital converter of clause 5, wherein the noise-shaping successive-approximation-register quantizer further includes a multi-input comparator having a first input terminal coupled to the positive output terminal, a second input terminal coupled to the negative output terminal, a third input terminal coupled to the positive integration capacitor, and a fourth input terminal coupled to the negative integration capacitor.

Clause 7. The sigma-delta analog-to-digital converter of clause 6, wherein the multi-input comparator is configured to apply a unity gain with respect to the first input terminal and the second input terminal and is configured to apply a higher gain with respect to the third input terminal and the fourth input terminal.

Clause 8. The sigma-delta analog-to-digital converter of any of clauses 4-7, wherein the high-order loop filter comprises:
  an input resistor;
  a continuous-time integrator coupled to the input resistor; and
  a discrete-time integrator coupled to the continuous-time integrator.

Clause 9. The sigma-delta analog-to-digital converter of clause 8, further comprising:
  a capacitive digital-to-analog converter configured to convert a digital output signal from the noise-shaping successive-approximation-register quantizer into a converted signal received by the continuous-time integrator.

Clause 10. The sigma-delta analog-to-digital converter of clause 8, wherein the input resistor is coupled between the continuous-time integrator and a micro-electromechanical system (MEMS) microphone.

Clause 11. The sigma-delta analog-to-digital converter of clause 10, wherein the sigma-delta analog-to-digital converter is incorporated within a cellular telephone.

Clause 12. A method of overload recovery, comprising:
  monitoring whether a noise-shaping quantizer is in an overload condition while the noise-shaping quantizer performs noise shaping during normal operation of the noise-shaping quantizer; and disabling the noise shaping in the noise-shaping quantizer for an overload recovery period in response to a detection of the overload condition.

Clause 13. The method of clause 12, further comprising:
  restarting the noise shaping in the noise-shaping quantizer in response to a termination of the overload recovery period.

Clause 14. The method of any of clauses 12-13, wherein the noise-shaping quantizer is a noise-shaping successive-approximation-register quantizer, and wherein disabling the noise shaping comprises preventing a plurality of integration switches in the noise-shaping successive-approximation-register quantizer from closing during the overload recovery period.

Clause 15. The method of clause 14, further comprising:
  closing the plurality of integration switches during integration phases of the normal operation of the noise-shaping successive-approximation-register quantizer.

Clause 16. The method of clause 14, wherein a duration of the overload recovery period is longer than an analog-to-digital calculation cycle of the noise-shaping successive-approximation-register quantizer.

Clause 17. A sigma-delta analog-to-digital converter, comprising:
a noise-shaping successive-approximation-register quantizer including a passive integrator configured to form an integration signal while the noise-shaping successive-approximation-register quantizer does not have an overload condition; and an overload detector configured to disable the passive integrator for an overload recovery period in response to a detection of the overload condition.

Clause 18. The sigma-delta analog-to-digital converter of clause 17, wherein the passive integrator comprises a plurality of integration switches, and wherein the overload detector is further configured to monitor a digital output signal from the noise-shaping successive-approximation-register quantizer to detect the overload condition.

Clause 19. The sigma-delta analog-to-digital converter of clause 18, wherein the passive integrator further comprises a plurality of integration capacitors, and wherein the noise-shaping successive-approximation-register quantizer further includes a capacitive digital-to-analog converter coupled to the plurality of integration capacitors during integration phases while the overload condition is not present.

Clause 20. The sigma-delta analog-to-digital converter of any of clauses 17-19, wherein the sigma-delta analog-to-digital converter is configured to digitize an audio signal from a micro-electromechanical system (MEMS) microphone.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A sigma-delta analog-to-digital converter, comprising:
a high-order loop filter;
a noise-shaping quantizer configured to quantize an analog signal processed by the high-order loop filter; and
an overload detector configured to disable noise shaping in the noise-shaping quantizer in response to a detection of an overload condition,
wherein the noise-shaping quantizer comprises a noise-shaping successive-approximation-register quantizer that includes:
a capacitive digital-to-analog converter;
a passive integrator; and
a plurality of integration switches configured to couple the capacitive digital-to-analog converter to the passive integrator during an integration phase, wherein the overload detector is further configured to prevent the plurality of integration switches from closing during an overload recovery period in response to the detection of the overload condition.

2. The sigma-delta analog-to-digital converter of claim 1, wherein the overload detector is further configured to compare a digital output signal from the noise-shaping quantizer to an overload threshold to detect the overload condition.

3. The sigma-delta analog-to-digital converter of claim 1, wherein the capacitive digital-to-analog converter includes a positive output terminal and a negative output terminal, and wherein passive integrator includes a positive integration capacitor and a negative integration capacitor, and wherein the plurality of integration switches includes a first integration switch coupled between the positive output terminal and the positive integration capacitor and includes a second integration switch coupled between the negative output terminal and the negative integration capacitor.

4. The sigma-delta analog-to-digital converter of claim 3, wherein the noise-shaping successive-approximation-register quantizer further includes a multi-input comparator having a first input terminal coupled to the positive output terminal, a second input terminal coupled to the negative output terminal, a third input terminal coupled to the positive integration capacitor, and a fourth input terminal coupled to the negative integration capacitor.

5. The sigma-delta analog-to-digital converter of claim 4, wherein the multi-input comparator is configured to apply a unity gain with respect to the first input terminal and the second input terminal and is configured to apply a higher gain with respect to the third input terminal and the fourth input terminal.

6. The sigma-delta analog-to-digital converter of claim 1, wherein the high-order loop filter comprises:
an input resistor;
a continuous-time integrator coupled to the input resistor; and
a discrete-time integrator coupled to the continuous-time integrator.

7. The sigma-delta analog-to-digital converter of claim 6, further comprising:
a capacitive digital-to-analog converter configured to convert a digital output signal from the noise-shaping successive-approximation-register quantizer into a converted signal received by the continuous-time integrator.

8. The sigma-delta analog-to-digital converter of claim 6, wherein the input resistor is coupled between the continuous-time integrator and a micro-electromechanical system (MEMS) microphone.

9. The sigma-delta analog-to-digital converter of claim 8, wherein the sigma-delta analog-to-digital converter is incorporated within a cellular telephone.

10. A method of overload recovery, comprising:
monitoring whether a noise-shaping quantizer is in an overload condition while the noise-shaping quantizer performs noise shaping during normal operation of the noise-shaping quantizer, wherein the noise-shaping quantizer is a noise-shaping successive-approximation-register quantizer; and
disabling the noise shaping in the noise-shaping quantizer for an overload recovery period in response to a detection of the overload condition, wherein disabling the noise shaping comprises preventing a plurality of integration switches in the noise-shaping successive-approximation-register quantizer from closing during the overload recovery period.

11. The method of claim 10, further comprising:
restarting the noise shaping in the noise-shaping quantizer in response to a termination of the overload recovery period.

12. The method of claim 10, further comprising: closing the plurality of integration switches during integration phases of the normal operation of the noise-shaping successive-approximation-register quantizer.

13. The method of claim 10, wherein a duration of the overload recovery period is longer than an analog-to-digital calculation cycle of the noise-shaping successive-approximation-register quantizer.

14. A sigma-delta analog-to-digital converter, comprising:
a noise-shaping successive-approximation-register quantizer that includes:
a capacitive digital-to-analog converter; and
a passive integrator configured to form an integration signal while the noise-shaping successive-approximation-register quantizer does not have an overload condition; and
an overload detector configured to disable the passive integrator for an overload recovery period in response to a detection of the overload condition,
wherein the noise-shaping successive-approximation-register quantizer further includes a plurality of integration switches configured to couple the capacitive digital-to-analog converter to the passive integrator during an integration phase, and wherein the overload detector is further configured to prevent the plurality of integration switches from closing during an overload recovery period in response to the detection of the overload condition.

15. The sigma-delta analog-to-digital converter of claim 14, wherein the overload detector is further configured to monitor a digital output signal from the noise-shaping successive-approximation-register quantizer to detect the overload condition.

16. The sigma-delta analog-to-digital converter of claim 15, wherein the passive integrator further comprises a plurality of integration capacitors, and wherein the capacitive digital-to-analog converter is coupled to the plurality of integration capacitors during integration phases while the overload condition is not present.

17. The sigma-delta analog-to-digital converter of claim 14, wherein the sigma-delta analog-to-digital converter is configured to digitize an audio signal from a micro-electromechanical system (MEMS) microphone.

* * * * *